(12) United States Patent
Zeng et al.

(10) Patent No.: US 9,709,896 B2
(45) Date of Patent: Jul. 18, 2017

(54) ILLUMINATION SYSTEM FOR LITHOGRAPHIC PROJECTION EXPOSURE STEP-AND-SCAN APPARATUS

(71) Applicant: Shanghai Institute of Optics And Fine Mechanics, Chinese Academy of Sciences, Shanghai (CN)

(72) Inventors: Aijun Zeng, Shanghai (CN); Liqun Chen, Shanghai (CN); Ruifang Fang, Shanghai (CN); Huijie Huang, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 28 days.

(21) Appl. No.: 14/984,891

(22) Filed: Dec. 30, 2015

(65) Prior Publication Data

US 2016/0109808 A1    Apr. 21, 2016

Related U.S. Application Data

(63) Continuation of application No. PCT/CN2013/001005, filed on Aug. 26, 2013.

(30) Foreign Application Priority Data

Jul. 1, 2013  (CN) .......................... 2013 1 0270245

(51) Int. Cl.
*G03B 27/54*   (2006.01)
*G03F 7/20*    (2006.01)

(52) U.S. Cl.
CPC ........ *G03F 7/7015* (2013.01); *G03F 7/70058* (2013.01); *G03F 7/70066* (2013.01)

(58) Field of Classification Search
CPC ............... G03F 7/7015; G03F 7/70083; G03F 7/70116; G03F 7/70191
USPC .................................. 355/52, 53, 55, 67–71
See application file for complete search history.

(56) References Cited

U.S. PATENT DOCUMENTS

| | | | |
|---|---|---|---|
| 8,004,656 B2 | 8/2011 | Fiolka et al. | |
| 9,599,904 B2 * | 3/2017 | Schubert | ............ G03F 7/70083 |
| 2002/0109108 A1 | 8/2002 | Mizouchi | |
| 2007/0146853 A1 | 6/2007 | Singer et al. | |
| 2009/0257041 A1 | 10/2009 | Boutonne et al. | |

FOREIGN PATENT DOCUMENTS

| | | |
|---|---|---|
| CN | 101165594 A | 4/2008 |
| CN | 101174093 A | 5/2008 |
| CN | 103092006 A | 5/2013 |

* cited by examiner

*Primary Examiner* — Hung Henry Nguyen
(74) *Attorney, Agent, or Firm* — Mei & Mark LLP; Manni Li

(57) ABSTRACT

Illumination system for a lithographic projection exposure step-and-scan apparatus comprising a light source, a pupil shaping unit, a field defining unit, a first lens array, a first slit array, a second lens array, a third lens array, a second slit array, a fourth lens array, a condenser lens, and a scanning drive unit sequentially arranged along the light beam propagation direction. The illumination system reduces requirements on lens processing, slit scanning speed, and slit scanning precision, therefore may be implemented more easily.

7 Claims, 4 Drawing Sheets

ILLUMINATION SYSTEM FOR LITHOGRAPHIC PROJECTION EXPOSURE STEP-AND-SCAN APPARATUS

CROSS-REFERENCE TO RELATED APPLICATIONS

The subject application is a continuation of PCT/CN2013/001005 filed on Aug. 26, 2013, which claims priority on Chinese patent application 201310270245.1 filed on Jul. 1, 2013 in China. The contents and subject matter of the PCT and Chinese priority applications are incorporated herein by reference.

TECHNICAL FIELD

The present invention relates to lithographic projection exposure apparatus, especially the illumination system for a lithographic projection exposure step-and-scan apparatus.

BACKGROUND OF THE INVENTION

Optical lithography is an optical exposure process which transfers the pattern of the mask plate onto the silicon wafer. According to different exposure methods, Optical lithography is divided into contact lithography, proximity lithography, step-and-repeat projection lithography, and step-and-scan projection lithography. Step-and-scan projection lithography may effectively increase the chip productivity, therefore it has become a mainstream lithography technology.

The illumination system is one of the key parts for a lithographic projection exposure step-and-scan apparatus. In order to precisely replicate various fine patterns onto the silicon wafer, the illumination system is required to form an illumination field with variable coherence factor and uniform intensity distribution, while achieving size adjustable by scanning the illumination field continuously.

U.S. Pat. No. 8,004,656B2 discloses an illumination system for lithographic projection exposure step-and-scan apparatus, which includes a light source, a beam expansion unit, a zoom lens group, a pair of axicon elements, a field defining component, a condenser lens, a reticle masking unit, a rema objective, and a reticle plane. Light emitted from the light source passes through the beam expansion unit, the zoom lens group, and a pair of axicon elements sequentially, becomes a beam distribution with specific illumination pattern and coherent factors, then is homogenized by the field defining unit and a condenser lens group, uniform intensity distribution field is formed at the reticle masking unit, finally imaged onto the mask by rema objective. The reticle masking unit plane is conjugate to the mask plane, so scanning reticle masking unit plane may scan the illumination field on the mask simultaneously. The structure of the illumination system is complex, the diameter of the condenser lens is about several hundred millimeters. And it requires a high scanning speed of the scanning slit, as high as up to several hundred millimeters per second, or even a few meters per second.

U.S. Patent Publication No. 2009/0257041A1 discloses another illumination system for lithographic projection exposure step-and-scan apparatus, the illumination system includes a source, a zoom, axicons, the array, a shutter plate, a condenser, and a mask. Light emitted from source is focused on the plane of the shutter plate by the array, enlarged by the condenser, and then superimposed on the mask. Means drives the shutter plate to move to scanning the illumination field on the mask. Compared with U.S. Pat. No. 8,004,656 B2, the system requires a lower scanning speed, but because the size of arrays is small, it needs up to micron even submicron precision during scanning.

SUMMARY OF THE INVENTION

The present invention overcomes the disadvantages of the current technology and provides an illumination system for a lithographic projection exposure step-and-scan apparatus that reduces the difficulty of lens processing, the requirements of slit scanning accuracy and speed, and therefore is easier to be implemented.

The present invention provides an illumination system for a lithographic projection exposure step-and-scan apparatus, comprises a light source, a pupil shaping unit, a field defining unit, a condenser, characterized in that it further comprises a first lens array, a first slit array, a second lens array, a third lens array, a second slit array, a fourth lens array, and a scanning drive unit. The first lens array, second lens array, third lens array, and fourth lens array have a plurality of lens of same parameters, these lens are periodically arranged in one spatial dimension or two spatial dimensions, where the first lens array, the second lens array, the third lens array, and the fourth lens array all have the same number of lens and the same arrangement of lenses. The corresponding axes of the first lens array, the second lens array, the third lens array, and the fourth lens array are superimposed, they are all passing through the centers of the transmissive slits of the first slit array and the second slit array. The clear apertures of the first lens array, the second lens array, the third lens array, and the fourth lens array are more than twice as much as that of the curved surface of micro-cylindrical lens in the field defining unit. Along the transmission direction of the light source, the pupil shaping unit, the field defining unit, the first lens array, the first slit array, the second lens array, the third lens array, the second slit, the fourth lens array, the condenser lens, and the mask are arranged successively, the output terminal of the scanning drive unit and the controlling ports of the first slit array and the second slit array are connected together. The image plane of the first lens array, the plane of the first slit array, and the object plane of the second lens array are superimposed. The image plane of the second lens array and the object plane of the third lens array are superimposed. The image plane of the third lens array, the plane of the second slit array, and the object plane of the fourth lens array are superimposed. The image plane of the fourth lens array and the object plane of the condenser lens are superimposed. The angular distribution of the light emitted from the light source is manipulated to conventional, annular, dipole, or quadrupole illumination mode after passing through the pupil shaping unit. The field definition unit homogenizes the light beam to form a uniform angular distribution. The light emitting from field defining unit is converged to the first slit array after passing through the first lens array. The second lens array and the third lens array form an afocal system, image the first slit array to the plane of the second slit array. The fourth lens array and the condenser lens enlarged image the second slit array to the mask. The scanning drive unit controls the moving speed and routes of plates in the first and the second slit array respectively, therefore scanning the corresponding illumination field. The scanning drive unit drives the plate in the first slit array and the plate in the second slit array to move along the +x axis and +y axis respectively, the illumination field on the mask is scanned along the +x axis and −y axis simultaneously.

The first slit array and the second slit array both have some transmissive slits and opaque parts, the number of the transmissive slits in the first and the second slit array are identical, both equal to the number of lens in the first lens array, in the second lens array, in the third lens array, or in the fourth lens array. The corresponding axes of the first lens array, the second lens array, the third lens array, and the fourth lens array are superimposed, they are all passing through the centers of the transmissive slits of the first slit array and the second slit array.

In the present invention, the first slit array and the second slit array are arranged in one dimension or two dimensions.

The advantages of the present invention are as follows:

1. To improve the illumination uniformity in the illumination system for lithography apparatus and correct various aberrations, aspheric lens is often used. The clear aperture of the lens in the illumination system in U.S. Pat. No. 8,004,656 B2 is about hundreds of millimeters, In comparison, the clear aperture of single lens in the present invention is between several millimeters to several centimeters, thus, processing smaller aspheric lens is more easier so the illumination system of the present invention reduces the processing difficulty and is easier to implement.

2. Compared to U.S. Pat. No. 8,004,656 B2, the slit movement distant is reduced by at least 75%, the slit scanning speed is reduced by at least 75%, and the slit movement distant is increased by at least 100% in the present invention. Compared to U.S. Patent Publication No. 2009/0257041 A1, the requirement of the slit scanning accuracy is reduced by at least 50%.

DETAILED DESCRIPTION OF THE INVENTION AND EMBODIMENTS

The present invention is further illustrated in the following examples and drawings which shall not be used to limit the scope of the invention.

Figure 1:
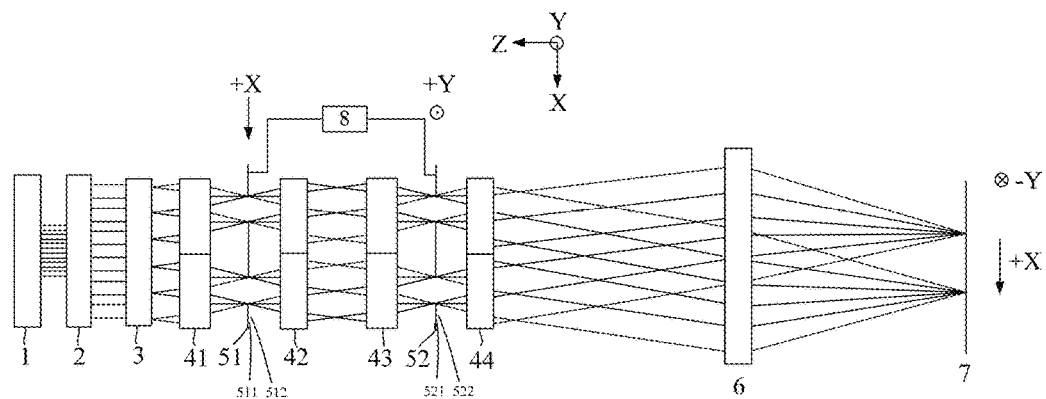
FIG. 1 is a schematic diagram showing the illumination system for lithographic projection exposure step-and-scan apparatus of the present invention.

As shown in FIG. 1, the present invention comprises a light source 1, a pupil shaping unit 2, a field defining unit 3, a first lens array 41, a first slit lens array 51, a second lens array 42, a third lens array 43, a second slit array 52, a fourth lens array 44, a condenser lens 6, and a scanning drive unit 8. The components are spatially related as follows; light emitted from light source 1 passes through pupil shaping unit 2, field defining unit 3, first lens array 41, first slit lens array 51, second lens array 42, third lens array 43, second slit array 52, fourth lens array 44, and condenser lens 6 sequentially, irradiates mask 7. The output terminal of the scanning drive unit 8 is connected with the first slit array 51, the second slit array 52. The image plane of the the first lens array 41, the plane of the first slit array 51 and the object plane of the second lens array 42 are superimposed. The image plane of the second lens array 42 and the object plane of the third lens array 43 are superimposed. The image plane of the third lens array 43, the plane of the second slit array 52, and the object plane of the fourth lens array 44 are superimposed. The image plane of the fourth lens array 44 and the object plane of the condenser 6 lens are superimposed.

Each component is used as follows: light emitted from light source 1 passes through the pupil shaping unit 2, becomes a beam distribution with specific pattern, then is homogenized by field defining unit 3, meanwhile becomes a beam distribution with specific angular distribution. Light emitted from the field defining unit 3 passes through the first lens array 41, then is focused onto the plane of the first slit array 51. The second lens array 42 and the third lens array 43 form an afocal system, image the first slit array 51 to the plane of the second slit array 52. The fourth lens array 44 and the condenser lens 6 enlarge the image from the second slit array 52 to the mask 7. The first lens array 51 is made of two identical plates 511 and 512 that coincide together. Each plate has some transmissive slits and opaque parts. The second lens array 52 is made of two identical plates 521 and 522 coincide together. Each plate has some transmissive slits and opaque parts. Connected with the controllers of plate 512 and plate 522, the output terminal of the scan driving unit 8 controls the moving speed and route of plate 512 and plate 522. When the clear aperture of the first slit array 51 and the second slit array 52 is changed, the light field is scanned. As shown in FIG. 1, the scanning drive unit 8 drives plate 512 and plate 522 to move along +x axis and +y axis, respectively, while the light field in the mask is scanned along +x axis and −y axis at the same time.

Figure 2:
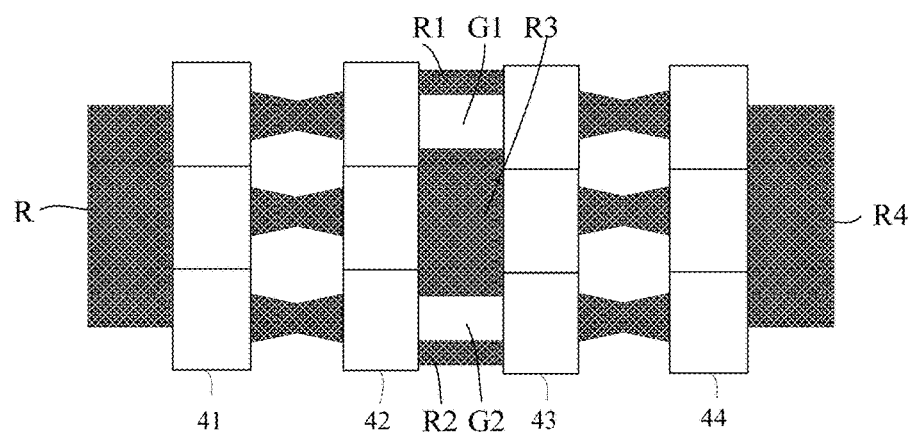
FIG. 2 is a schematic diagram showing light passing through the first lens array, the second lens array, the third lens array, and the fourth lens array of the illumination system for lithographic projection exposure step-and-scan apparatus of the present invention.

As shown in FIG. 2, light passes through the first lens array, the second lens array, the third lens array, and the fourth lens array. After passing through the first lens array 41 and the second lens array 42, ray R is splitted to ray R1, ray R2, and ray R3, these three rays are merged to ray R4 after passing through the third lens array 43, the fourth lens array 44. Gap G1 exists between ray R1 and the middle ray R3, and gap G2 exists between ray R2 and the middle ray R3, while ray R and ray R4 are identical. It is apparent that, without the third lens array 43 and the fourth lens array 44, the illumination pattern is different from the preliminary settings. After adding the third lens array 43 and fourth lens array 44, the illumination pattern is the same with the preliminary settings. According to the principles of the present invention, the first lens array 41, the first slit array 51, the second lens array 42, the third lens array 43, the second slit array 52, and the fourth lens array 44 are configured as one dimension or two dimensions simultaneously.

Figure 3:
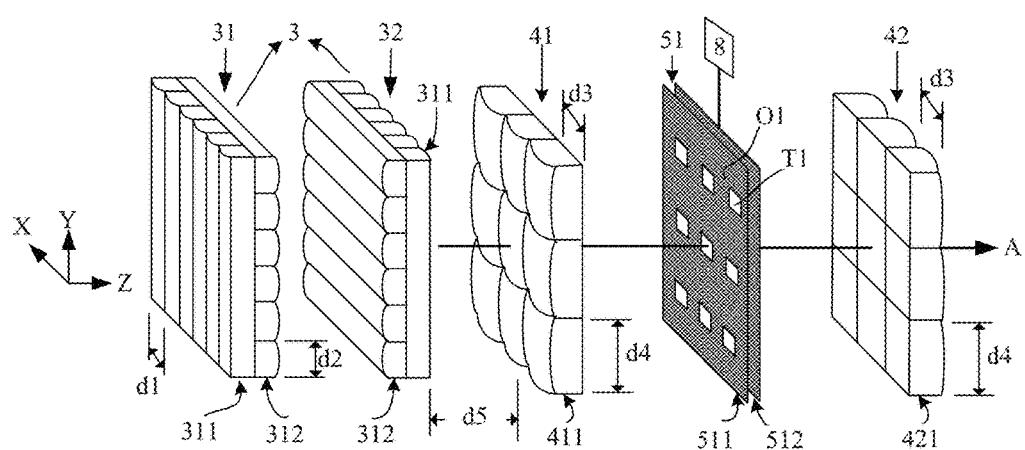
FIG. 3 is a schematic diagram showing the structure from the field defining unit to the second lens array in the first embodiment of the illumination system for lithographic projection exposure step-and-scan apparatus of the present invention.

As shown in FIG. 3, in the first embodiment of the present invention, the field defining unit is composed of the first microlens array 31 and the second microlens array 32. The front surface of the first microlens array 31 has micro cylindrical lens 311 with generatrix along Y direction, these micro cylindrical lens are arranged along the X direction with cycle d1. The rear surface of the first microlens array 31 has micro cylindrical lens 312 with generatrix along X direction, these micro cylindrical lens are arranged along the Y direction with cycle d2. The front surface of the second microlens array 32 and the rear surface of the first microlens array 31 are identical, the rear surface of the second microlens array 32 and the front surface of the first microlens array 31 are identical. The first lens array 41 is composed with several identical lens 411, these lens are two-dimensional periodically arranged with cycle d3 along x direction and cycle d4 along y direction. The second lens array 42 is composed with several identical lens 421, and these lens are two-dimensional periodically arranged with cycle d3 along x direction and cycle d4 along y direction. The distance d5 between the front surface of the first lens array 41 and the rear surface of the microlens array 32 is above 5 mm, in order to collect more lights and thus improves light usage efficiency. The clear aperture of lens 411 in the first lens array 41 is twice more than that of the curved surface of micro-cylindrical lens in the field defining unit, that is d3>2d1, d4>2d2. The second lens array 42 and the first lens array 41 both have the same number of lens and the same arrangement of lenses, the optical axis A of corresponding lens is parallel with the Z axis, and passing through the center of the transmissive slits T1 of the first slit array. In addition, the first lens array 41, the second lens array 42, the third lens array 43, and the fourth lens array 44 all have the same number of lenses and the same arrangement manner, the optical axis of the corresponding lens is parallel to the Z axis, and passes through the centers of the transmissive slits of the first slit array.

Figure 4:
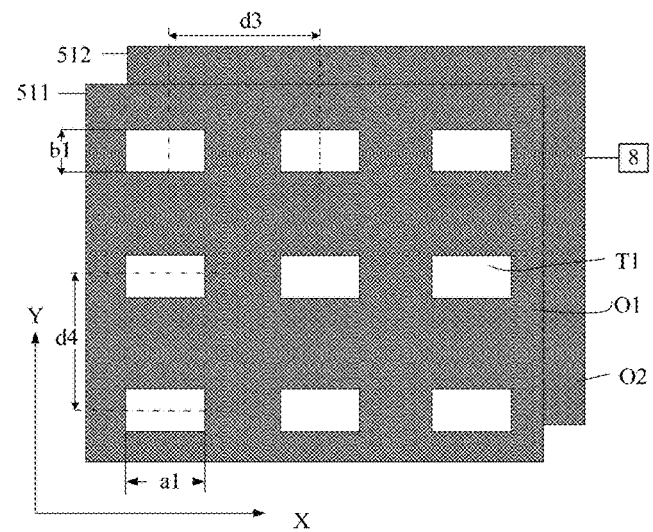
FIG. 4 is schematic diagram showing the first slit array in the first embodiment of the illumination system for lithographic projection exposure step-and-scan apparatus of the present invention.

FIG. 4 shows the first slit array in the first embodiment of the present invention. The first slit array 51 has plate 511 and plate 512, where plate 511 includes a plurality of transmissive slits T1 and opaque parts T0, the structure of the plate 512 and the plate 511 are identical, and the controller of the plate 511 is connected with the output terminal of the drive unit 8. The scanning process is as follows: the plate 511 keeps stationary, the drive unit 8 drives the plate 512 to move along X or Y direction, leading to the transmissive slits T1 to be reduced in size, thereby the illumination field on the mask 7 is scanned. While a1 and b1 are the sizes of the transmissive slits of the plate 511 in Y-direction and X direction, respectively, d3 and d4 are the cycles of the plate 511 in the X direction and Y-direction, respectively. They must meet the requirements: d3>2a1, d4>2b1, in order to ensure that, during scanning, the opaque portion 02 of 512 may completely cover the transmissive slits T1 of 511. The second slit array 52 and the first slit array 51 are identical, and one cooperation of the first slit array 51 and the second slit array 52 is as follows: driven by the driving unit 8, the plate 512 of the first slit array 51 scans in the Y direction, the second slit array 52 keeps stationary, the illumination field on the mask 7 is scanned in the Y direction, driven by the driving unit 8, the plate 512 of the first slit array 51 scans in the Y direction, the plate 522 of the second slit array 52 scans in the X direction, the illumination field on the mask 7 is scanned in the Y and X direction simultaneously. The first slit array 51 and the second slit array 52 have a variety of combinations, not limited to the two listed above. The corresponding axes of the first lens array 41, the second lens array 42, the third lens array 43, and the fourth lens array 44 are superimposed, they are all passing through the centers of the transmissive slits of the first slit array 51 and the second slit array 52.

According to the principles of the present invention, the first lens array 41, the first slit array 51, the second lens array 42, the third lens array 43, the second slit array 52, and the fourth lens array 44 may be configured as one dimension or two dimension.

Figure 5:
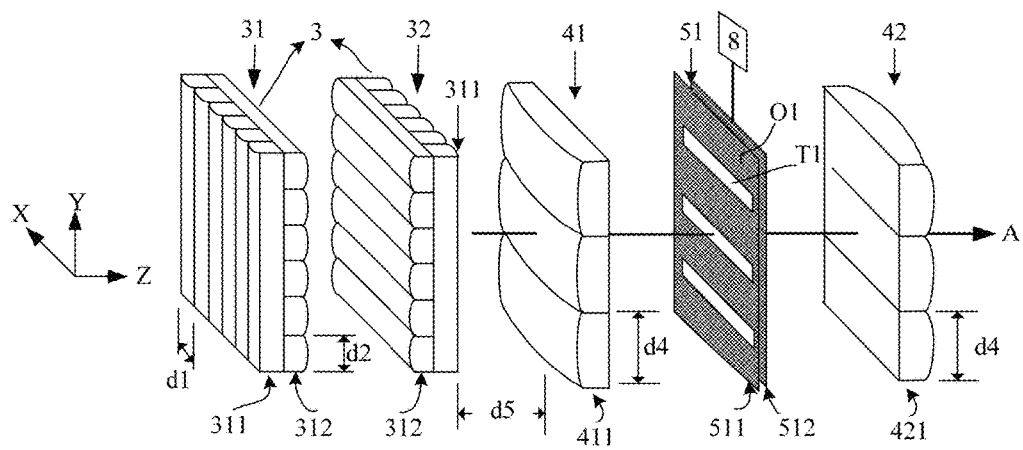
FIG. 5 is a schematic diagram showing the structure from the field defining unit to the second lens array in the second embodiment of the illumination system for lithographic projection exposure step-and-scan apparatus of the present invention.

As shown in FIG. 5, in the structure of the field defining unit to the second lens array according to the second embodiment of the present invention, the field defining unit comprises the microlens array 31 and the microlens array 32. The front surface of the first microlens array 31 has micro cylindrical lens 311 with generatrix along Y direction, these micro cylindrical lens are arranged along the X direction with cycle d1. The rear surface of the first microlens array 31 has micro cylindrical lens 312 with generatrix along X direction, these micro cylindrical lens are arranged along the Y direction with cycle d2. The front surface of the second microlens array 32 and the rear surface of the first microlens array 31 are identical, the rear surface of the second microlens array 32 and the front surface of the first microlens array 31 are identical. The first lens array 41 comprises several same lens 411, these lens are periodically arranged with cycle d4 in the y direction. The clear aperture of the first lens array 41 is twice larger than the clear aperture of the curved surface of micro-cylindrical lens in field defining unit 3, that is, d4>2d2. The first slit array 51 comprises plate 511 and plate 512, where the plate 511 has a plurality of transmissive slits T1 and opaque parts T0, which are arranged in one dimension, the structure of the plate 512 and the plate 511 are identical, the controller of the plate 511 is connected with the output terminal of the drive unit 8, the second lens array 42 and the first lens array 41 have the same number of lenses and the same arrangement manner, in addition, the optical axis A of the corresponding lens is parallel with the Z axis, and passing through the centers of the transmissive slits T1 of the first slit array. In addition, the first lens array 41, the second lens array 42, the third lens array 43, and the fourth lens array 44 all have the same number and arrangement of lens, and their corresponding axes of are superimposed, they are all passing through the centers of the transmissive slits of the first slit array 51 and the second slit array 52.

Figure 6:
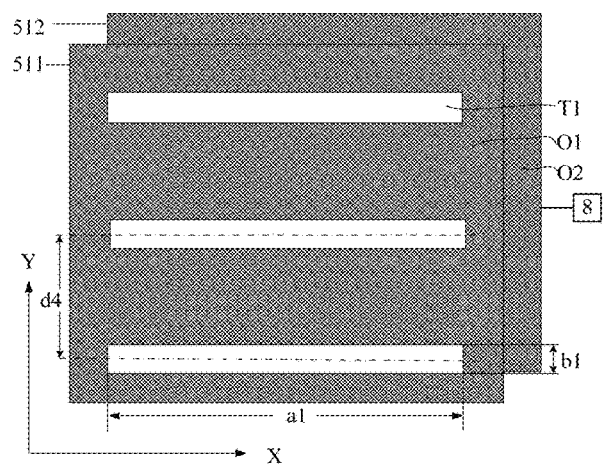
FIG. 6 is a schematic diagram showing the first slit array in the second embodiment of the illumination system for lithographic projection exposure step-and-scan apparatus of the present invention.

As shown in FIG. 6, in the second embodiment of the present invention, the first slit array 51 comprises the plate 511 and the plate 512, where the plate 511 includes a plurality of transmissive slits T1 periodically arranged along the Y direction and opaque parts T0, the structure of the plate 512 and the plate 511 are identical, and the controller of the plate 512 is connected with the output terminal of the drive unit 8. The scanning process is as follows: the plate 511 keeps stationary, the drive unit 8 drives the plate 512 to move along y direction, leading the transmissive slits T1 to be reduced in size, thereby the illumination field on the mask 7 is scanned in the Y direction. Where a1 and b1 are the sizes of the transmissive slits of the plate 511 in Y-direction and X direction, respectively, d4 is the cycle of the plate 511 in the Y-direction. They must satisfy the relationship: d4>2b1, in order to ensure that, during scanning, the opaque portion O2 of 512 may completely cover the transmissive slits T1 of 511. The second slit array 52 and the first slit array 51 are the identical, and one cooperation of the first slit array 51 and the second slit array 52 during scanning is as follows: driven by the driving unit 8, the plate 512 of the first slit array 51 scans in the Y direction, the second slit array 52 keeps stationary, the illumination field on the mask 7 is scanned in the Y direction. The clear aperture may be changed by altering the slit size in the X direction of the second slit array 52, thereby limiting the field size in the X direction. Another cooperation is that the first slit array 51 keeps stationary, driven by the driving unit 8, the plate 522 of the second slit array 52 scans in the Y direction, the illumination field on the mask 7 is scanned in the Y direction, the clear aperture may be changed by altering the slit size in the X direction of the first slit array 51, thereby limiting the field size in the X direction.

Figure 7:
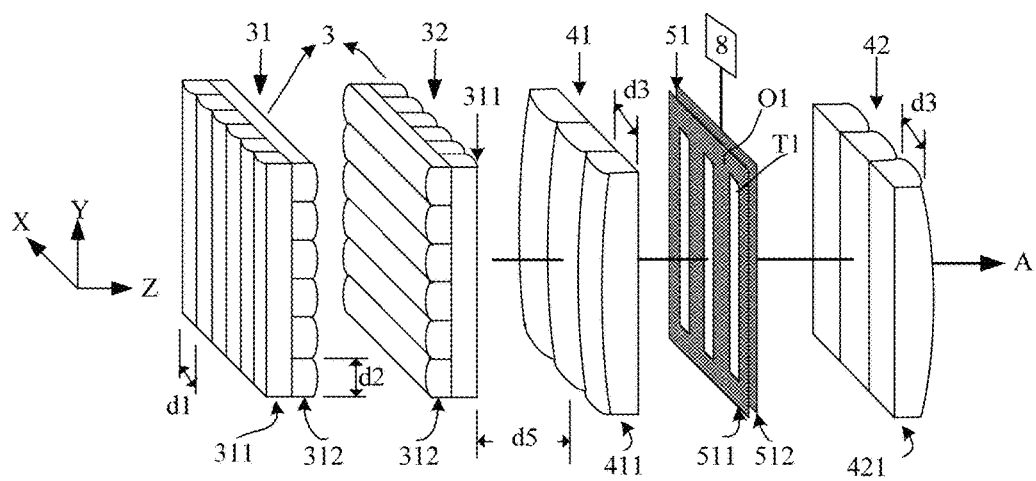
FIG. 7 is a schematic diagram showing the field defining unit to the second lens array in the third embodiment of the illumination system for lithographic projection exposure step-and-scan apparatus of the present invention.

As shown in FIG. 7, in the field defining unit to the second lens array according to the third embodiment of the present invention, the microlens array 31 comprises the micro lens 31 and the micro lens 32. The front surface of the first microlens array 31 is micro cylindrical lens 311 with generatrix along Y direction periodically arranged along the X-direction with cycle d1. The rear surface is micro cylindrical lens 312 with generatrix along X direction periodically arranged along the Y-direction with cycle d2. The front surface of the second microlens array 32 and the rear surface of the first microlens array 31 are identical, while the rear surface of the second microlens array 32 and the front surface of the first microlens array 31 are identical. The first lens array 41 has a single lens 411 periodically arranged with cycle d3 in the y direction. The clear aperture of the first lens array 41 is twice larger than the clear aperture of the curved surface of micro-cylindrical lens in field defining unit 3, that is, d3>2d1. The second lens array 42 and the first lens array 41 all have the same number of lenses and the same arrangement manner, the optical axis A of the corresponding lens is parallel with the Z axis and passes through the centers of the transmissive slits T1 of the first slit array. In addition, the first lens array 41, the second lens array 42, the third lens array 43, and the fourth lens array 44 all have the same number of lenses and the same arrangement manner, the optical axis of the corresponding lens is parallel with the Z axis, and passes through the centers of the transmissive slits of the first slit array and the second slit array simultaneously.

Figure 8:
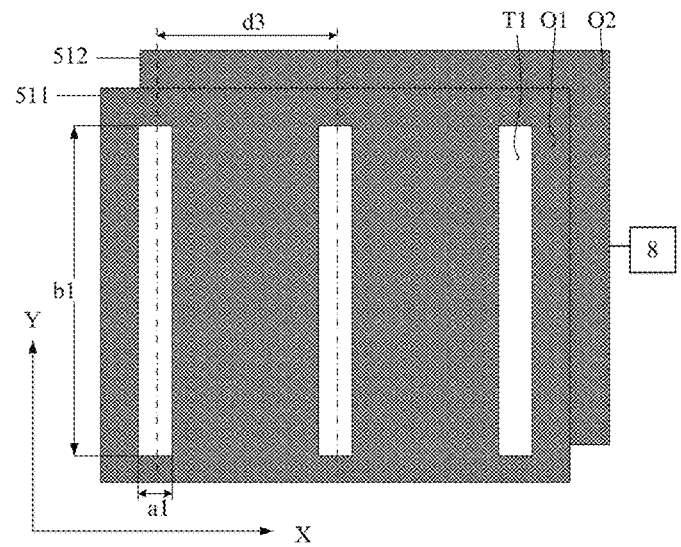
FIG. 8 is a schematic diagram showing the first slit array in the third embodiment of the illumination system for lithographic projection exposure step-and-scan apparatus of the present invention.

As shown in FIG. 8, the first slit array in the third embodiment of the present invention 51 comprises the plate 511 and the plate 512. The plate 511 has a plurality of transmissive slits T1 periodically arranged along the Y-direction and opaque parts T0, the structure of the plate 512 and the plate 511 are identical, and the controller of the plate 512 is connected with the output terminal of the drive unit 8. During the scanning process, the plate 511 keeps stationary, the drive unit 8 drives the plate 512 move along X direction, leading the size of the transmissive slits T1 to be reduced, thereby the illumination field on the mask 7 is scanned in the X direction. Where a1 and b1 are the sizes of the transmissive slits of the plate 511 in x-direction and Y direction, respectively, d3 is the cycle in the X direction. They must satisfy the relationship that d3>2a1 in order to ensure that, during scanning, the opaque portion O2 of 512 may completely cover the transmissive slits T1 of 511. The second slit array 52 and the first slit array 51 are identical, and one cooperation of the first slit array 51 and the second slit array 52 is as follows: driven by the driving unit 8, the plate 512 of the first slit array 51 scans in the x direction, the second slit array 52 keeps stationary, the illumination field on the mask 7 is scanned in the x direction. The clear aperture may be changed by altering the slit size in the Y direction of the first slit array 51, thereby limiting the field size in the Y direction. Another cooperation is that the first slit array 51 keeps stationary, driven by the driving unit 8, the plate 522 of the second slit array 52 scans in the x direction, the illumination field on the mask 7 is scanned in the x direction, the clear aperture may be changed by altering the slit size in the Y direction of the first slit array 51, thereby restrict the field size in the Y direction.

We claim:

1. An illumination system for a lithographic projection exposure step-and-scan apparatus, comprising
   a light source,
   a pupil shaping unit,
   a field defining unit comprising a first microlens array and a second microlens array having micro-cylindrical lenses with curved surface,
   a condenser lens,
   a first lens array,
   a first slit array comprising controlling ports,
   a second lens array,
   a third lens array,
   a second slit array,
   a fourth lens array,
   a mask, and
   a scanning driver unit comprising an output terminal,
   wherein the light source, the pupil shaping unit, the field defining unit, the first lens array, the first slit array, the second lens array, the third lens array, the second slit array, the fourth lens array, the condenser lens, and the mask are successively arranged along transmission direction of light;
   the first lens array, the second lens array, the third lens array, and the fourth lens array have the same number of lens and the same arrangement of lenses, and the corresponding axes of lens in the first lens array, the second lens array, the third lens array, and the fourth lens array are superimposed;
   the clear apertures of the first lens array, the second lens array, the third lens array, and the fourth lens array are twice more than the clear aperture of the curved surface of micro-cylindrical lens in the field defining unit;
   the output terminal of the scanning drive unit is connected with the controlling ports of the first slit array and the second slit array;
   the image plane of the second lens array and the object plane of the third lens array are superimposed;
   the image plane of the third lens array, the plane of the second slit array, and the object plane of the fourth lens array are superimposed; and
   the image plane of the fourth lens array and the object plane of the condenser lens are superimposed.

2. The illumination system for a lithographic projection exposure step-and-scan apparatus according to claim 1, wherein a light beam is emitted from the light source;
   angular distribution of the light beam is manipulated to conventional, annular, dipole, or quadrupole illumination mode after passing through the pupil shaping unit;
   the field definition unit homogenizes the light beam to form a light with a uniform angular distribution;
   the light emitted from the field defining unit is converged to the first slit array after passing through the first lens array;
   the second lens array and the third lens array form an afocal system, and form an image from the first slit array to the plane of the second slit array;
   the fourth lens array and the condenser lens enlarge the image of the second slit array to the mask;

the scanning drive unit controls moving speed and routes of the plates in the first slit array and the plates in the second slit array, respectively, to scan corresponding illumination field; and the scanning drive unit drives the plate in the first slit array and the plate in the second slit array to move along x axis and y axis, respectively, and the illumination field on the mask is scanned along +x axis and −y axis simultaneously.

3. The illumination system for a lithographic projection exposure step-and-scan apparatus according to claim 1, wherein the front surface of the first microlens array of the field defining unit comprises micro-cylindrical lenses with generatrix along Y direction and are arranged along the X direction with cycle d1;

the rear surface of the first microlens array comprises micro-cylindrical lenses with generatrix along X direction and are arranged along the Y direction with cycle d2;

the front surface of the second microlens array of the field defining unit and the rear surface of the first microlens array are identical; and the rear surface of the second microlens array and the front surface of the first microlens array are identical.

4. The illumination system for a lithographic projection exposure step-and-scan apparatus according to claim 1, wherein the first slit array and the second slit array both comprise a plurality of transmissive slits and opaque parts.

5. The illumination system for a lithographic projection exposure step-and-scan apparatus according to claim 4, wherein the number of the transmissive slits in the first slit array and the number of the second slit array are identical, and both are equal to the number of the lens in the first lens array, in the second lens array, in the third lens array, or in the fourth lens array.

6. The illumination system for a lithographic projection exposure step-and-scan apparatus according to claim 5, wherein corresponding axes of the first lens array, the second lens array, the third lens array, and the fourth lens array are superimposed and all pass through the centers of the transmissive slits of the first slit array and those of the second slit array.

7. The illumination system for a lithographic projection exposure step-and-scan apparatus according to claim 1, wherein the first slit array and the second slit array are configured as one-dimension or two-dimension simultaneously.

* * * * *